(12) United States Patent
Brown et al.

(10) Patent No.: US 7,482,207 B2
(45) Date of Patent: Jan. 27, 2009

(54) ELECTRONIC DEVICES

(75) Inventors: Thomas Meredith Brown, Cambridge (GB); Henning Sirringhaus, Cambridge (GB)

(73) Assignee: Plastic Logic Limited, Cambridge (GB)

( * ) Notice: Subject to any disclaimer, the term of this patent is extended or adjusted under 35 U.S.C. 154(b) by 221 days.

(21) Appl. No.: 10/538,870

(22) PCT Filed: Dec. 12, 2003

(86) PCT No.: PCT/GB03/05435

§ 371 (c)(1),
(2), (4) Date: Dec. 22, 2005

(87) PCT Pub. No.: WO2004/055920

PCT Pub. Date: Jul. 1, 2004

(65) Prior Publication Data

US 2006/0148167 A1    Jul. 6, 2006

(30) Foreign Application Priority Data

Dec. 14, 2002    (GB) ................................ 0229191.2

(51) Int. Cl.
*H01L 21/00* (2006.01)
(52) U.S. Cl. ................. 438/149; 257/E23.179
(58) Field of Classification Search ................. 438/149, 438/672, 71; 257/E23.179
See application file for complete search history.

(56) References Cited

U.S. PATENT DOCUMENTS

2005/0071969 A1 * 4/2005 Sirringhaus et al. .......... 29/4.51
2006/0272942 A1 * 12/2006 Sirringhaus ................. 204/406
2006/0286726 A1 * 12/2006 Sirringhaus et al. ......... 438/151

FOREIGN PATENT DOCUMENTS

| WO | 0147044 A2 | 6/2001 |
| WO | 0160589 A1 | 8/2001 |
| WO | 0229912 A1 | 4/2002 |
| WO | 0247183 A1 | 6/2002 |

OTHER PUBLICATIONS

Francis Garnier, et al., Vertical Device Architecture by Molding of Organic-Based Thin Film Transistor, Applied Physics Letters, vol. 73, No. 12, Sep. 21, 1998, pp. 1721-1723.
H. Sirringhaus, et al., High-Resolution Ink-Jet Printing of All-Polymer Transistor Circuits, MRS Bulletin/Jul. 2001, pp. 539-543.
C.R. Kagan, et al., Patterning Organic-Inorganic Thin-Film Transistors Using Microcontact Printed Templates, Applied Physics Letters, vol. 79, No. 21, Nov. 19, 2001 pp. 3536-3538.

* cited by examiner

*Primary Examiner*—Thao P. Le
(74) *Attorney, Agent, or Firm*—Sughrue Mion, PLLC

(57) ABSTRACT

A method for forming an electronic device in a multilayer structure comprising the steps of: defining a topographic profile in a laterally extending first layer; depositing at least one non-planarizing layer on top of the first layer such that the topographic profile of the surface of the or each non-planarizing layer conforms to that of the laterally extending first layer; and depositing a pattern of at least one additional layer onto the top-most non-planarizing layer, such that the lateral location of the additional layer is defined by the shape of the topographic profile of the non-planarizing layer, and whereby the additional layer is laterally aligned with the topographic profile in the first layer.

38 Claims, 10 Drawing Sheets

(A)

(B)

(C)

(A)

(B)

(C)

ELECTRONIC DEVICES

This is a National Stage of PCT/GB2003/005435, filed Dec. 12, 2003, the disclosure of which is incorporated herein by reference.

This invention relates to electronic devices, especially organic electronic devices, and methods for forming such devices.

Semiconducting conjugated polymer thin-film transistors (TFTs) have recently become of interest for applications in cheap, logic circuits integrated on plastic substrates (C. Drury, et al., APL 73, 108 (1998)) and optoelectronic integrated devices and pixel transistor switches in high-resolution active-matrix displays (H. Sirringhaus, et al., Science 280, 1741 (1998). A. Dodabalapur, et al. Appl. Phys. Lett. 73, 142 (1998)). In test device configurations with a polymer semiconductor and inorganic metal electrodes and gate dielectric layers high-performance TFTs have been demonstrated. Charge carrier mobilities up to 0.1 $cm^2/Vs$ and ON-OFF current ratios of $10^6$-$10^8$ have been reached, which is comparable to the performance of amorphous silicon TFTs (H. Sirringhaus, et al., Advances in Solid State Physics 39, 101 (1999)).

One of the advantages of polymer semiconductors is that they lend themselves to simple and low-cost solution processing. However, fabrication of all-polymer TFT devices and integrated circuits requires the ability to form lateral patterns of polymer conductors, semiconductors and insulators. Various patterning technologies such as photolithography (WO 99/10939 A2), screen printing (Z. Bao, at al., Chem. Mat. 9, 1299 (1997)), soft lithographic stamping (J. A. Rogers, Appl. Phys. Lett. 75, 1010 (1999)) and micromoulding (J. A., Rogers, Appl. Phys. Lett. 72, 2716 (1998)), as well as direct ink-jet printing (H. Sirringhaus, et al., UK 0009911.9) have been demonstrated.

Many direct printing techniques are unable to provide the patterning resolution that is required to define the source and drain electrodes of a TFT. In order to obtain adequate drive current and switching speed channel lengths of less than 10 μm are required. In the case of inkjet printing this resolution problem has been overcome by printing onto a prepatterned substrate containing regions of different surface free energy (H. Sirringhaus et al., UK 0009915.0).

In patent application PCT/GB01/04421 a method is disclosed that allows fabrication of polymer TFTs by a combination of direct write printing and embossing. The method is based on forcing a master containing an array of sharp protruding wedges into a substrate containing at least one polymer layer, and at least one conducting layer, and microcutting the conducting layer to form source and drain electrodes of the TFTs. The method disclosed can also be applied to multilayer structures containing more than one conducting layer, and allows the formation of vertical field-effect transistor (FET) devices in which the transistor channel is formed on a vertical side wall formed by the embossing step and the channel length of the FET is defined by the thickness of a deposited insulating or semiconducting film, and not by a high resolution patterning step. This method allows for the low-cost fabrication of FETs with submicrometer channel lengths.

In patent application PCT/GB01/04421 a method for defining a self-aligned gate electrode is also disclosed. The method is based on using the topographical profile that is generated by an embossing step that define source-and-drain electrode to confine the deposition of the gate electrode.

In self-aligned device architectures the position of the gate electrode is automatically adjusted and aligned with respect to source and drain electrodes. This is very attractive for many circuit applications as this minimizes the parasitic capacitance between source-drain and gate electrodes. This is particularly important for printed devices where the width of deposited conducting electrodes and interconnects tends to be large, i.e. on the order of 20-100 μm. Furthermore the positional accuracy of drop placement in a technique such as direct inkjet printing is usually not sufficient to achieve small overlap capacitance. Often in order to ensure that the gate electrode overlaps with the active channel region everywhere, and to allow for any statistical deviation of drop placement a relatively large overlap is required. In a self-aligned device the gate electrode is confined automatically to the region of the channel between source-and-drain electrodes without overlapping with the conducting source-drain electrode regions themselves, i.e. the area of overlap is approximately L W (L: channel length, W: channel width) as opposed to d W (d: width of the printed gate lines). In this way the parasitic overlap capacitance is reduced significantly.

According to a first aspect of the present invention there is provided a method for forming an electronic device in a multilayer structure comprising embossing a topographic profile into a substrate consisting of a first and second depressed (protruding) region, and a third protruding (depressed) region separating the first and second region, comprising the additional step of depositing a solution of conductive or semiconductive material into the first or second region. The method may also include selective modification of the surface energy of the embossed substrate prior to deposition of the conductive or semiconductive material so as to reduce the wetting of the solution of conductive or semiconductive material in the third region.

According to another aspect of the present invention there is provided a method for forming a self-aligned electronic device in a multilayer structure comprising defining a topographic profile in a first layer depositing at least one additional, conformal layer on top the first layer, selectively modifying the surface energy of said additional layer, and depositing a pattern of at least one additional layer in registration with the topographic profile in the first layer.

According to another aspect of the present invention there is provided a method for forming a vertical-channel field-effect transistor comprising the step of embossing a substrate containing at least one polymer layer and pushing a portion of a conducting electrode into the substrate, so as to form source and drain electrodes of a vertical-channel transistor.

According to yet another aspect of the present invention there is provided a method for forming a surface energy pattern by embossing, that is used to direct the deposition of materials for formation of at least one of the layers of a field effect transistor device.

According to another aspect of the present invention there is provided methods and devices as set out in the accompanying claims.

Other aspects of the invention include devices formed by that and other methods, and integrated circuits, logic circuits, display circuits, sensing devices and/or memory device circuits comprising one or more of such devices. Preferably the said devices are formed on a common substrate. Preferably the said devices are formed in a common layer of an organic material.

Preferred aspects of the present invention relate to methods by which solid state embossing can be used to fabricate polymer transistor devices and circuits.

Embodiments of the present invention will now be described, by way of example only, with reference to the accompanying drawings, in which.

Figure 1:
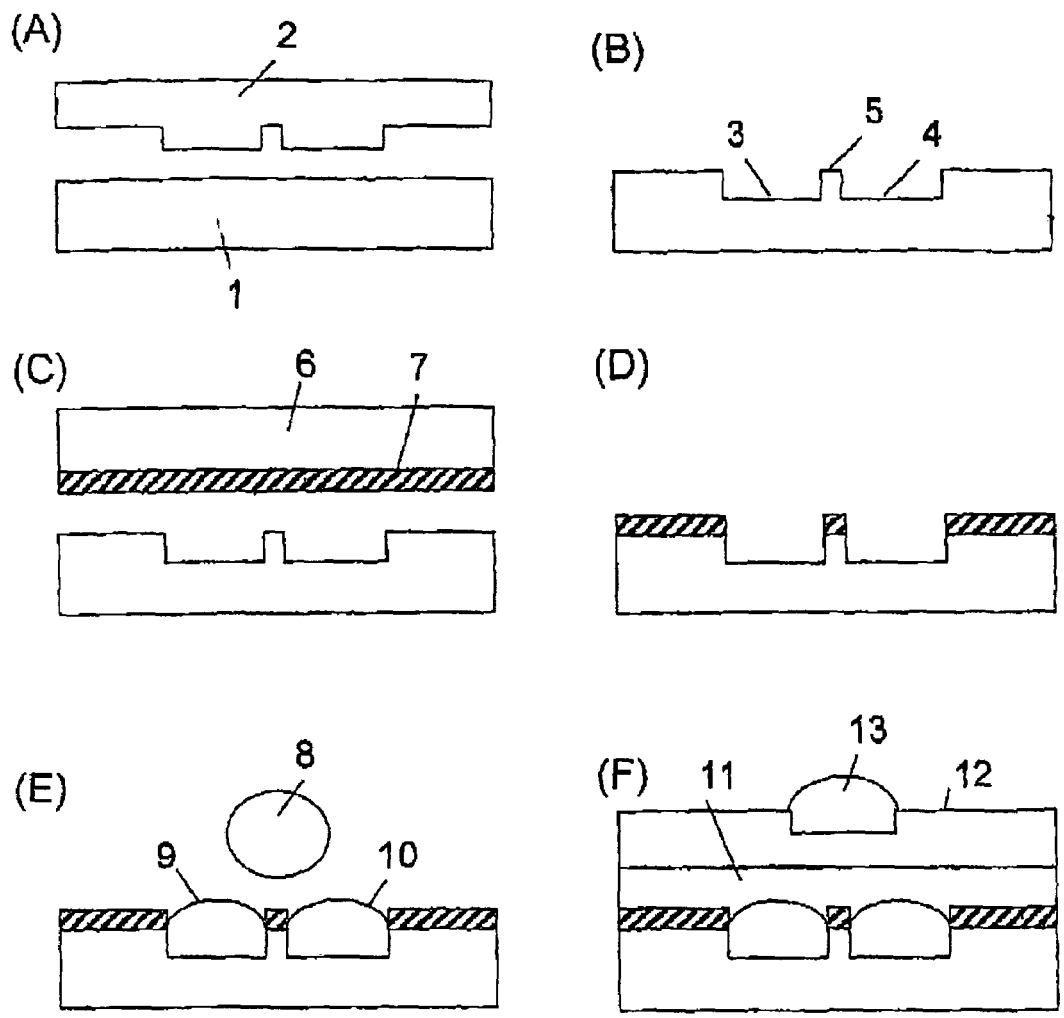
FIG. 1 is a schematic diagram of one embodiment of the invention that allows definition of source and drain electrode of a planar FET with high resolution.

FIG. 1 shows a schematic diagram of the use of embossing to define the critical channel length of a FET device. The substrate 1 is a flexible plastic substrate such as poly(ethleneterephtalate) (PET), polyethersulphone (PES) or polyethernaphtalene (PEN). Alternatively, the substrate may also be a rigid substrate, such as a glass substrate, coated with a polymer layer. The substrate is embossed by pressing an embossing tool 2 containing an array of protruding features into the substrate. The embossing step is performed at elevated temperatures, preferably close to the glass transition temperature of the substrate or the topmost layer on the substrate. The embossing step may also be performed by bringing the substrate 1 into its liquid phase. Preferably, the thickness of the polymer layer is chosen to be larger than the height of the protruding features of the embossing tool. If the polymer layer is thinner than the height of the protruding features of the master, care needs to be taken to minimize damage of the embossing tool. After the embossing step a conductive ink 8 is deposited into the embossed grooves. The ink can be deposited in the form of droplets, such as for example by inkjet printing, aerosol deposition, or spray costing, or as a continuous film, for example, by blade coating, spin coating, or dip coating. By capillary forces the deposition of the conductive ink is confined to the grooves 3,4 on the substrate that define the source and drain electrodes of the FET. No deposition occurs on top of the narrow ridge 5 defining the channel length L of the device.

In order to enhance the confinement of the deposited ink into the grooves the surface on top of the narrow ridge 5 and in the other flat regions of the substrate can be modified selectively to provide a surface energy contrast between the L wetting surface in the grooves and a low-energy, dewetting surface on top of the ridge 5. This can be achieved by first preparing the whole surface of the substrate in a high energy, wetting state by for example, using a polar polymer layer with a high surface energy as the embossed surface layer 1 of the substrate, or by exposing the substrate to an $O_2$ plasma or UV/ozone surface treatment. Subsequently, the substrate is brought in contact with a flat stamp 6 inked with a self-assembled monolayer (SAM) 7 that is capable of bonding to functional groups on the surface of the substrate. Suitable SAMs are for example octyltrichlorosilane $C_8H_{17}SiCl_3$ (OTS) or fluoroalkyltrichlorosilane $C_nF_{2n+1}C_mF_{2m}SiCl_3$ or equivalent methoxy silanes. Due to the topographic profile on the substrate the SAM is transferred selectively only in the flat regions of the substrate and on top of the ridge 5, rendering those surface regions non-wetting for the ink to be deposited, while the bottom and side walls of the grooves 3,4 remain wetting. This selective surface modification that is enabled by the topographical profile on the substrate provides a strong confining force for the deposition of the conductive ink. Examples of conducting inks include a conducting polymer such as polyethylene-dioxythiophene doped with polystyrene sulfonic acid (PEDOT/PSS) or a conducting inorganic dispersion of metallic nanoparticles or chemical precursor solution for an inorganic metal formulated in a solvent. This surface modification method will be referred to as "flat stamp method" in the following.

Alternatively, the selective surface modification making use of the topographic profile on the surface can be defined by other techniques such as for example vacuum evaporation of a surface modifying layer at an oblique angle. If the substrate is not held normally with respect to a focussed beam of atoms or molecules evaporating from a source, but an oblique angle the depressed regions of the substrate are shadowed by the raised portions of the surface. The surface modifying material is only evaporated onto the raised portions of the modifying material is deposited onto sidewalls of the substrate separating the raised regions from the depressed regions.

After forming the source and drain electrodes 9,10 in this way the device is completed by depositing a layer of semiconducting material 11, such as regioregular poly(3-hexylthiopene) (P3HT) or poly(dioctylfluorene-co-bithiophene) (F8T2), a layer of gate dielectric 12, such as a polymer layer of poly(methylmethacrylate (PMMA) and by printing a pattern of conducting material for the gate electrode. The gate electrode 13 can be formed from a conducting polymer such as PEDOT/PSS or a inorganic metal. Both the active semiconductor and the dielectric layer may also be patterned, such as to form an active layer island of the device in order to reduce crosstalk between neighbouring devices.

The channel length of the device which is defined by the width of the ridge 5 is preferably less than 20 µm, preferably less than 5 µm an most preferably less than 1 µm. The minimum channel length is determined by the resolution with which the pattern of protruding features on the embossing tool can be defined, and the mechanical properties of the polymer substrate determining the maximum aperture ratio of pillars embossed in the polymer substrate. A polymer that is suitable for achieving narrow ridges with good aperture ratio is PMMA.

The depth of the grooves 3,4 can be used to vary the conductivity of the source-drain electrodes. In order to achieve good charge injection into the semiconducting active layer it is desirable to fill the grooves 3,4 up to the top of the groove, such that the surface of the substrate after deposition of the conducive electrodes is effectively planarized. In order to fabricate low resistance source and drain electrodes a deep groove can be used in order to allow deposition of a very thick conductive film into the grooves.

Figure 2:
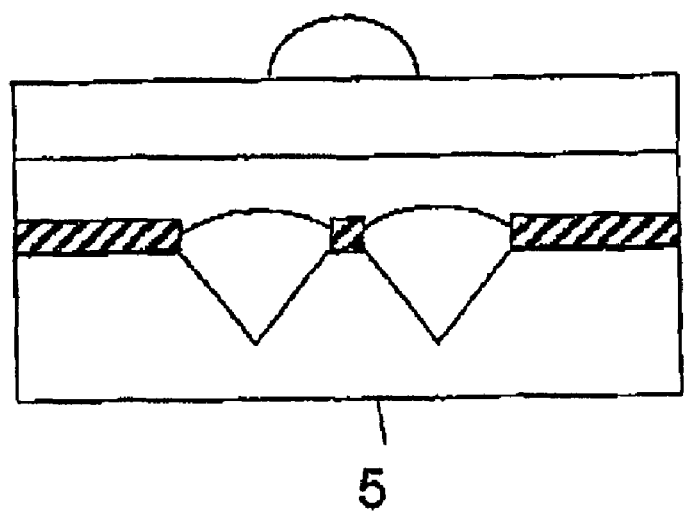
FIG. 2 is a schematic diagram of a variant of the embodiment in FIG. 1, in which the embossing master has the shape of a sharp protruding wedge.

The shape of the embossed grooves may have any form, such as a square profile (FIG. 1) or a triangular groove (FIG. 2). In the case of a triangular groove very high resolution patterning can be achieved. In this case the surface of the sharp ridge 5 is essentially a line of arbitrarily small width. When the surface energy of such a ridge is modified by bringing it into contact with a flat stamp the width of the dewetting surface region that defined the channel length of the transistor is limited only by the elastic deformation of the flat substrate, and by the diffusion of the SAM molecules on the surface of the substrate. Minimum width can be achieved, for example, by reducing the pressure with which the flat stamp is pressed against the substrate, by reducing the time of contact, or by choosing a SAM molecule that has a small diffusion coefficient on the surface of the substrate. The method in FIG. 2 allows easy fabrication of devices with submicrometer channel length.

The methods disclosed above can be applied analogously to bottom gate devices (where instead of the substrate it is the gate insulator that is embossed). In this case care needs to be taken that the depth of the embossed grooves is significantly smaller than the thickness of the gate dielectric in order to prevent electrical shorts of the gate dielectric.

According to another aspect of the invention a method for forming a FET device with a self-aligned gate electrode is disclosed. In order to achieve fast switching of FETs in a logic circuit it is important to reduce parasitic overlap capacitance due to geometric overlap between the gate electrode and the source/drain electrodes. In a conventional device architecture the overlap capacitance can only be reduced by reducing the linewidth of the gate electrodes and by accurately registering the gate electrode with respect to the source/drain electrodes. When printing techniques are used to define electrodes this is often challenging. In order to achieve narrow line widths with a technique such as inkjet printing droplets with small droplet volumes need to be produced and the spreading of such droplets on the substrate must be controlled by a surface energy pattern that is accurately aligned with respect to the previously deposited patterns. In a self-aligned device the gate electrode is aligned automatically with respect to eh previously defined channel and is confined to the channel region itself, not overlapping with the metallic source/drain electrodes.

Figure 3:
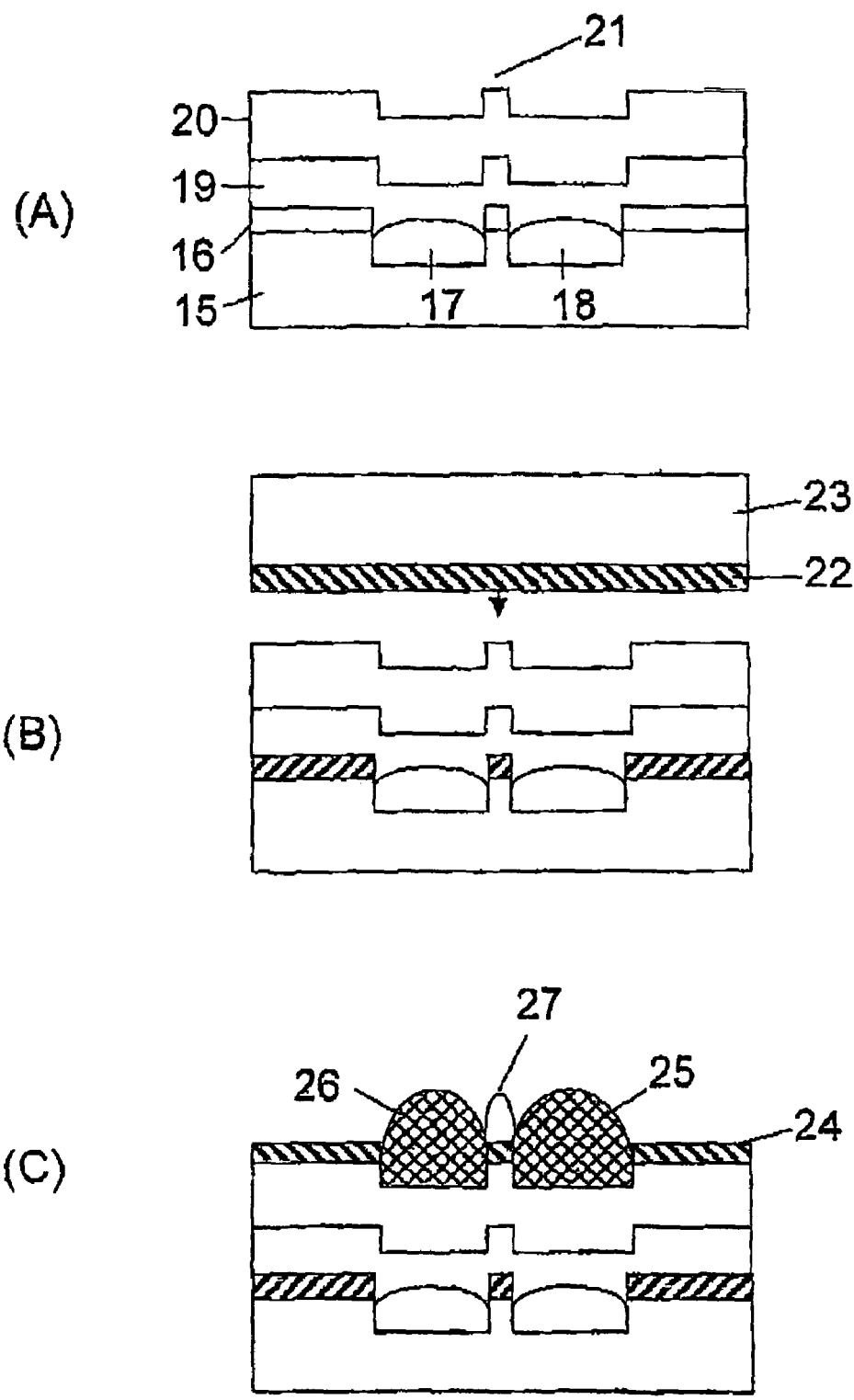
FIG. 3 is a schematic diagram of a top-gate planar FET device with a gate electrode that is self-aligned with the source and drain electrodes.

The invention is based on making use of a topographic surface profile that is generated in a first layer to define a surface energy pattern in an upper layer that is self-aligned with respect to the topographic profile in the first layer. It is an essential feature of the invention that one or more layers are deposited on top of the first layer without planarising fully the topography in the first layer. In one embodiment of the invention (FIG. 3) In a first step a pattern of source/drain electrodes is defined in a similar way as described in FIG. 1. However, in this case the grooves are not filled completely and a surface topography profile remains on the surface after deposition of the conductive material into the grooves 17,18.

The deposition conditions for the semiconducting material 19, and the gate dielectric material 20 are chosen such as to preserve this topographic profile, i.e. a conformal coating is required. In the case of solution deposition, this can be achieved by adjusting the surface energy, and viscosity of the polymer solutions as well as the molecular weight of the polymers. Alternatively (in the case of a small molecule organic semiconductor such as pentacene) the layers can be deposited conformally by vacuum deposition techniques. Solution self-assembly techniques such as the growth of polymer brushes on the surface can also be used.

If the source/drain electrodes are defined using embossed depressions in the substrate the gate electrode needs to be confined to a webbing protrusion on the surface of the gate dielectric. Different techniques can be used to achieve this in one embodiment of the invention the surface of the gate dielectric is prepared in a non-wetting state for the ink of the conductive gate electrode. The surface of the substrate is then laminated by bringing it into contact with a flat stamp containing a surface modification material such as a SAM that is able to bond to a functional group on the surface, and has a tail that contains a polar group such as a carboxylic acid group. In contact with the stamp the top of the ridge 21 is then made wetting for the ink of the conducting gate material, while the bottom of the grooves remain non-wetting, and self-aligned confinement of the gate ink droplets on top of the ridge 21 can be achieved.

Alternatively, in an intermediate step a low-surface energy polymer 25/26 is printed into the grooves on the surface of the gate dielectric. To help the confinement of this polymer into the grooves the surface of the gate dielectric can be modified selectively by the technique described above using a dewetting surface modification layer 24. After the deposition of the hydrophobic polymer the surface of the substrate is then made wetting, for example, by a low-energy $O_2$ plasma or UV/ozone exposure. During this step the surface of the ridge 21 is made wetting again. If the hydrophobic polymer is a fluoropolymer such as Teflon AF, the surface of the hydrophobic polymer remain low energy during the wetting treatment. In a final step the gate electrode is then printed and is confined in a self-aligned manner to the narrow ridge 21. Alternatively, the topographic profile of the hydrophobic polymer 25/26 can be used to selectively modify the surface of the hydrophobic polymer 25/26 to become hydrophobic again after the treatment that provides wetting properties to the ridges. This can be achieved by the flat stamp method described above.

Figure 4:
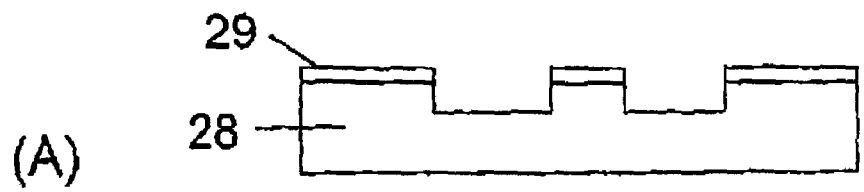
FIG. 4 is a schematic diagram of a bottom gate planar FET device with a gate electrode that is self-aligned with the source and drain electrodes.
Figure 4:
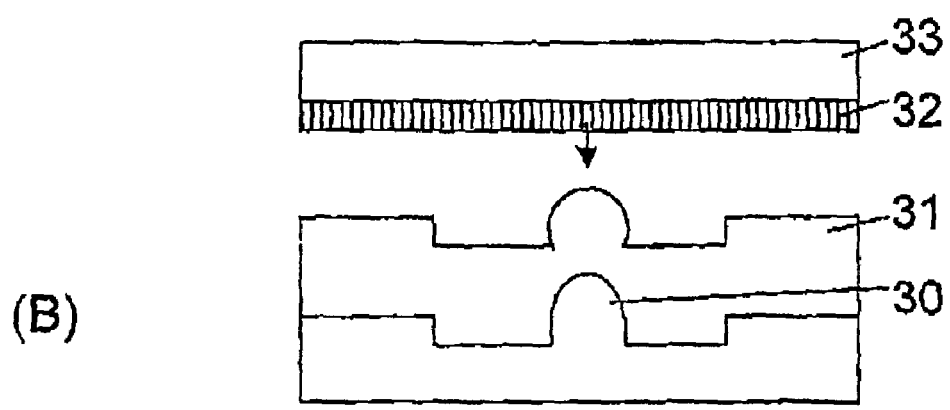
Figure 4:
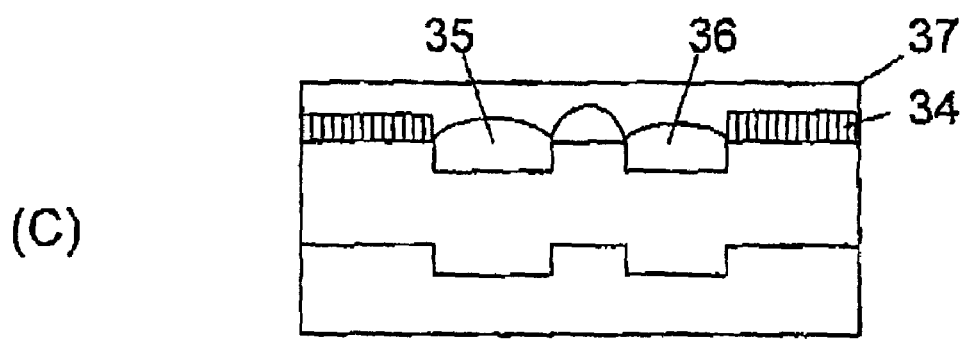

FIG. 4 shows an alternative device architecture for a bottom gate FET device with a self-aligned gate electrode. In this case the gate electrodes is defined first on the substrate using an embossed topographic profile and a SAM layer 29 that renders the flat portions of the substrate wetting while the bottom and side walls of the grooves remain non-wetting. In this way confinement of the gate electrode to the ridge defined by the embossing step is achieved. This is followed by the conformal, non-planarizing deposition of a dielectric layer 31, the surface of which reflects the topographical profile embossed in the substrate. The surface of the dielectric is then prepared to be wetting (for example, by exposing the substrate to an $O_2$ plasma treatment or by using a dielectric polymer that is wetting for the conducting ink for source/drain electrodes, such as polyvinylphenol in the case of PEDOT/PSS). Subsequently the surface of the dielectric is modified selectively by bringing a flat stamp in contact with the surface. The stamp contains a self-assembled monolayer 32 that renders the flat surface regions 34 non-wetting. In this way ink deposition for the source/drain electrode 35,36 can be confined to the embossed grooves. The embossed ridge defines the channel of the device. The channel is self-aligned with the underlying gate electrode.

Figure 5:
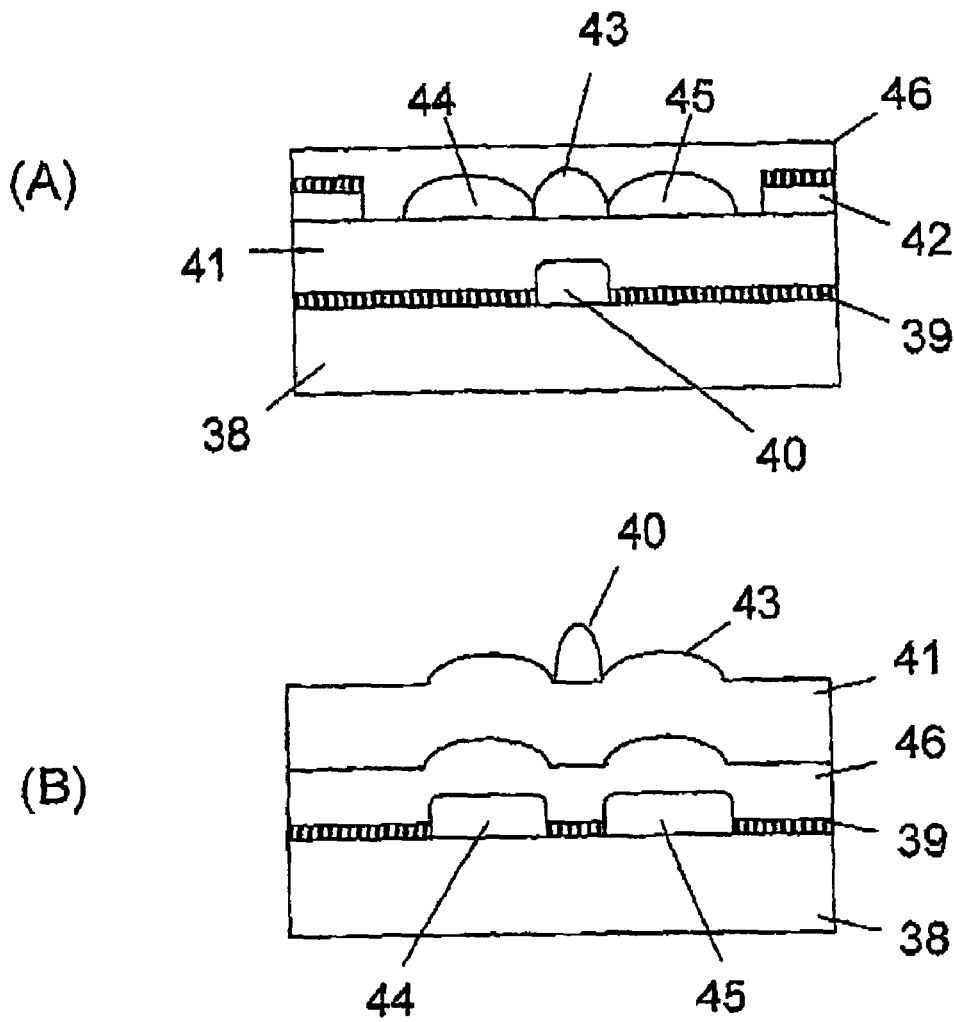
FIG. 5 is a schematic diagram of a bottom-gate (a) and top gate (b) FET device in which the electrodes in an upper layer are self-aligned by the topographic profile generated by electrodes deposited in a lower layer.

According to another aspect of the invention the topographic profile that is required for the self-alignment of patterns in upper layers with respect to patterns in lower layers can be generated by patterned deposition of material onto the substrate itself without the need for an embossing step, in one embodiment a first pattern of electrodes is defined on the surface (gate in bottom-gate structure in FIG. 5(a) and source/drain in top-gate structure in FIG. 5(b)), for example with the help of a surface energy pattern 39 as disclosed in UK 0009915.0. The thickness of the electrode material is preferably larger than 50 nm, most preferably larger than 150 nm. The material is preferably deposited in such a way that the thickness is uniform across the area of the electrode, and that the thickness profile near the edge of the electrode is abrupt. Subsequently, layers of dielectric 41 and semiconducting 46 material are deposited conformally onto the substrate, in such a way that the topographic profile generated by the first electrode pattern is preserved on the surface for the self-aligned deposition of a second set of electrodes (source/drain electrodes 44/45 in FIG. 5(*a*) and gate electrode 40 in FIG. 5(*b*)). Prior to the deposition of the second set of electrodes the surface of the substrate is modified selectively by bringing the substrate in contact with a flat stamp containing a SAM that is transferred selectively onto the substrate and lowers the surface energy. In some cases it might be necessary to deposit a mechanical support layer 42, in order to avoid contact between the flat stamp and the substrate in the electrode regions. Such contact would be established due to sagging of the stamp, if the distance between protruding features exceeds a critical distance, that depends on the height of the protrusions and the rigidity of the stamp. Sagging can also be prevented if mechanical support features are deposited on the level of the first set of electrodes, with similar topography requirements as for the first set of electrodes.

An alternative selective surface modification technique to the flat stamp method described above is as follows. On top of the corrugated surface to be modified selectively, a planarizing sacrificial continuous layer is deposited by a technique such as, but not limited to spin coating. Suitable planarizing polymer solutions are AccuFlo, commercially available from Honeywell. The substrate is then exposed to an etching step, for example to an $O_2$ plasma etching step, until the surface of the raised portions of the underlying substrate layer is exposed again, while the indented regions remain protected by the sacrificial layer. Then the surface energy of the surface layer is modified, for example by exposing the substrate to a vapour of a self-assembling molecule. During this step the indented portions of the surface are protected by the sacrificial layer. Then the sacrificial layer is removed in such a way that the surface energy in the modified regions remains unchanged. For example the sacrificial layer can be removed by washing the substrate in a solvent in which the sacrificial layer is soluble, but in which the surface layer is insoluble. In this way selective surface energy patterning can be achieved without the need to bring the corrugated surface in physical contact with a flat stamp.

Alternatively, exposure to a plasma, for example, $CF_4$ plasma, may be used to after the surface energy of the substrate or a subsequently deposited layer.

According to another aspect of the present invention a novel architecture is disclosed for a vertical channel field-effect transistor, as well as a method for manufacturing such a device.

In a vertical TFT (see for example, A. Salton, et al. Jpn. J. Appl. Phys. 36, 668, (1997)) the channel length is defined by the thickness of one of the deposited layers as opposed to a high-resolution patterning step in the case of a planar TFT. In one possible configuration a mesa-type structure is deposited first consisting of source and drain electrode layers separated by a thin dielectric layer the thickness of which determines the channel length of the TFT. A vertical side wall is then formed by appropriate means such as a chemical etching process. Semiconducting and insulating layers are deposited onto the side walls followed by a gate electrode. Vertical TFTs have been fabricated using inorganic materials. They are useful because they allow formation of submicrometer channel lengths without requiring expensive lithographic tools, but offering enhanced circuit speed and drive currents.

Manufacturing of vertical polymer TFTs is difficult, mainly due to problems associated with forming vertical sidewalls. Chemical etching methods for forming side walls pose problems because of the high solubility of polymers in common organic solvents and the lack of anisotropic etching mechanisms that in the case of inorganic semiconductors cause etching to proceed faster in one crystallographic direction than in others allowing formation of well defined facets. More directional, physical etching methods such as reactive ion etching suffer from degradation of electrically functional polymers upon plasma exposure.

In UK PCT/GB01/04421 a method is demonstrated by which vertical channel field-effect transistors can be defined by microcutting a polymer multilayer structure with a sharp protruding wedge in order to define a vertical side wall in the polymer multilayer structure exposing cross-section of the various layers in the multilayer structure. The method is based on forming a microcut groove in which during the embossing step materials transport occurs sideways in the plane of the substrate. The various layers are microcut, and pushed aside by plastic flow when the master penetrates into the substrate.

In the present method for forming a vertical field-effect device materials transport during the embossing step is primarily normal to the substrate, and not sideways. In one embodiment of the invention (FIG. 6) a conducting layer 55 on a substrate 54 is embossed with a tool 56 containing an array of protruding features with sharp edges. The substrate 54 is preferably a flexible electrically insulating substrate such as PET, PEN or PES, or a rigid substrate containing at least one flexible polymer layer that is electrically insulating. The radius of curvature of the sharp edge is preferably less than 100 μm, most preferably less than 10 μm. Preferably, the protruding features have a rectangular profile, although other protruding profiles are also possible. During the embossing step, a portion 57 of the conducting layer 55 is pushed into the substrate, separating region 57 electrically from the remaining conducting regions 58 and 59. In this way source and drain electrodes of the device are defined. This structure is then coated conformally with a layer of semiconducting material 60, and gate dielectric 61. Finally a gate electrode 63 is deposited. Preferably, the gate electrode is self-aligned with the source/drain electrodes. In one embodiment of the invention the deposition of the gate electrode is confined to the embossed groove with the help of a surface energy barrier 62, that is deposited selectively in the flat regions of the substrate using the flat stamp method. It is important that the thickness of the gate electrode in the groove is sufficient to allow accumulation of the transistor channel along the full length of the transistor channel.

In this structure the channel length is defined by the depth of the embossed groove. This can be controlled with the height of the protrusion on the embossing master, in case the master is embossed to its maximum depth into the substrate, or with the embossing pressure, time and temperature, in case the master is embossed only partially into the substrate, i.e., to less than the maximum depth. The method allows convenient definition of submicrometer channel lengths.

Figure 6:
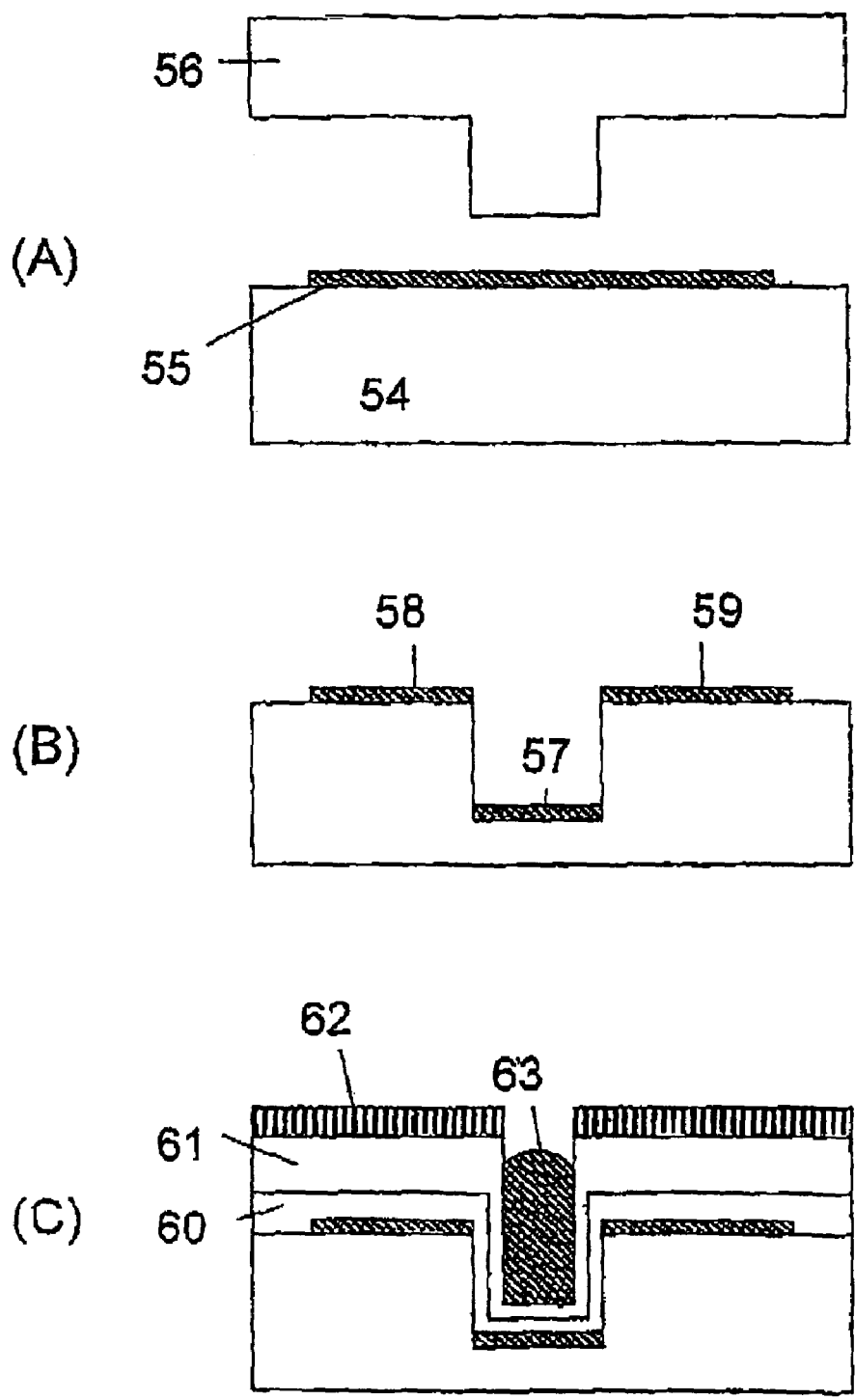
FIG. 6 shows a device structure for a vertical-channel FET with a self-aligned gate electrode.

In the device structure shown in FIG. 6 vertical channels are formed on all sides of the embossed groove. For a given surface area of the device, the transistor current can be maximised by increasing the length of the side wall, for example by forming the protrusion on the embossing tool in the shape of a spiral.

In the device structure in FIG. 6 the overlap capacitance between the gate electrode 63 and source/drain electrode 58/59 is very small, while the overlap capacitance between the gate electrode and source/drain electrode 57 is significant. When the device is used for fast switching, for example in a logic circuit or in an active matrix display, the electrodes should be connected in such a way that the switching performance is optmised. In an active matrix display configuration, for example, where any overlap capacitance between the pixel electrode and the gate electrode is undesirable due to kick-back voltages appearing on the pixel electrode upon switching of the gate voltages, electrode 58 or 59 should be connected to the pixel electrode, while electrode 57 should be connected to the data addressing line.

Figure 7:
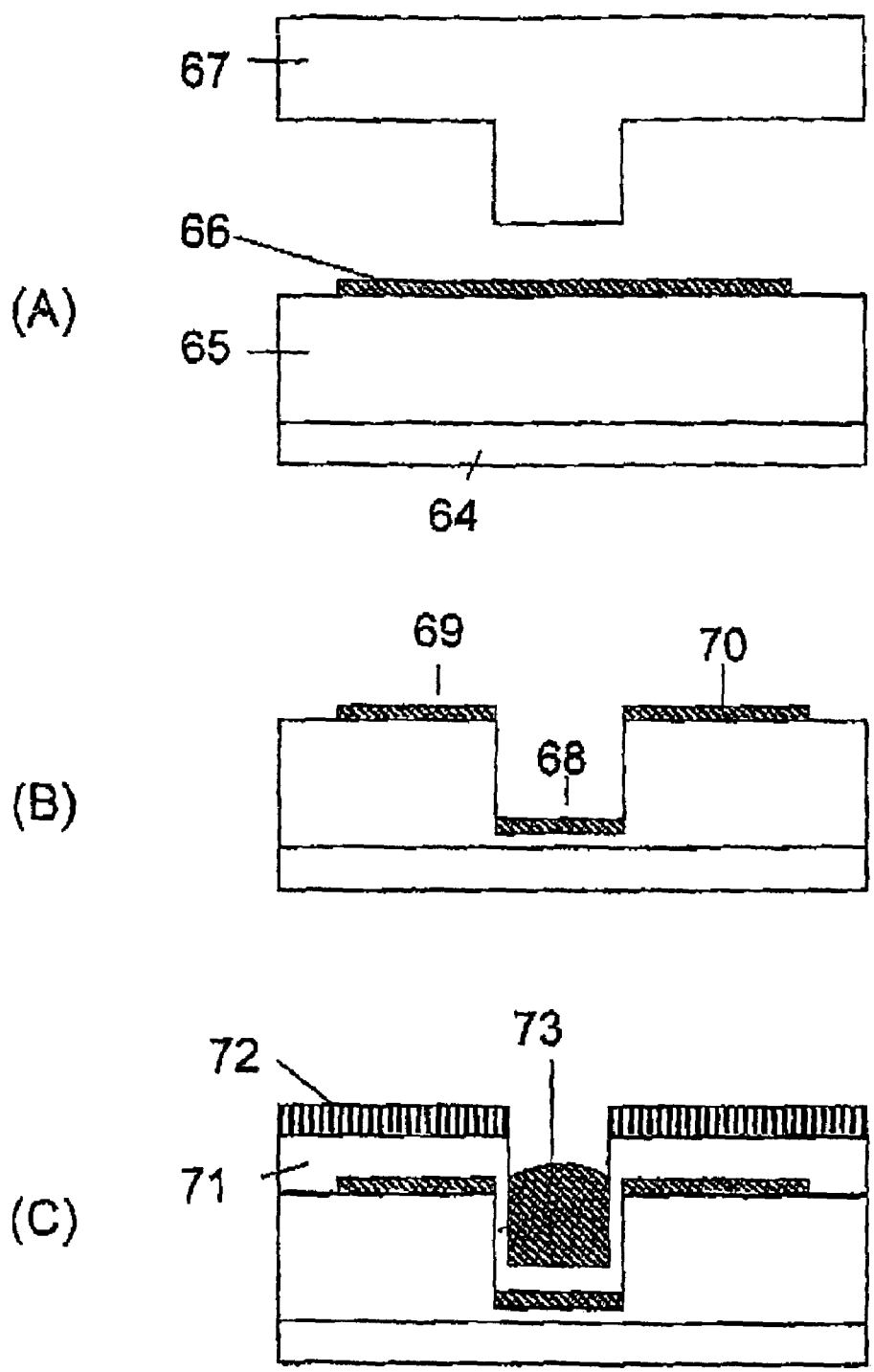
FIG. 7 shows another device structure for a vertical-channel FET with a self-aligned gate electrode.

An alternative device structure is shown in FIG. 7. The structure is similar to that in FIG. 6, but in this case the semiconducting material 65 is part of the substrate that is embossed. On top of the semiconducting layer a conducting layer 66 is coarse patterned. The thickness of the semiconducting layer needs to be as large as the depth to which the substrate is embossed, in order to ensure that the vertical side wall between source/drain electrodes 69 and 68 is fully formed from semiconducting material. The device is completed by deposition of a gate dielectric 71 and gate electrode 73. A surface energy barrier 72 can be used to help confining the sate electrode to the embossed groove.

One of the attractive features of the device configuration in FIG. 7 is that during the embossing step the chains of the semiconducting polymer can be aligned along the direction of downward materials transport, i.e. along the direction of current flow in the device. This results in improved field-effect mobilities and device performance.

The main advantage of the structure in FIGS. 7 and 6 compared to that in UK PCT/GB01/04421 is that in the former case efficient carrier injection from the source and drain electrodes in the channel can be achieved easily, because the semiconducting layer and the source and drain electrodes are in contact over a large area. In the device configuration described in UK PCT/GB01/04421 at least one of the buried conducting electrodes is only in contact with the semiconducting layer in a cross-sectional, vertical area, one side of which is determined by the small thickness of the buried metallic electrode. This may give rise to an enhanced parasitic source-drain contact resistance, particularly in situations where the ionisation potential of the semiconducting material is larger, for hole conduction-based devices, or smaller for electron conduction-based devices, than the Fermi level of the conducting source and drain electrodes.

Electrical contact to the conducting layer in the depressed region can be made by opening a via hole interconnection in the depressed region. In cases where the width of the depressed region is too narrow to open a via-hole interconnection without the risk of generating an electrical short to the conducting layer in regions 58,69 the protruding wedge on the embossing tool that defines the depressed region might for example, be extended beyond the conductive layer. Subsequently, a solution of conducting material can then be deposited into the depressed groove at a safe distance away from region 58,59, and the solution be transported through the groove by capillary force and contacts the conducing material 57 in the depressed region.

An alternative architecture for the device shown in FIGS. 6 and 7 is to use the depressed region of the substrate as a floating bridge electrode. In this case the embossing step is arranged in such a way that the embossing tool pushes a portion of the conducting layer into the substrate, and in this way interrupts the conductivity between a first (undepressed) region of the conducting layer 68, and the depressed region of the conducting layer, and between the first (undepressed) region of the conducting layer 58 and a second (undepressed) region of the conducting layer 59. The first and second region of the conducting layer are then used as source-drain electrodes of the transistor and the depressed region is used as a floating bridge electrode in the channel of the transistor. The floating bridge electrode shortens the channel length of the transistor. The active semiconducting channel region of the device only comprises two vertical channels formed along the two vertical side walls defined by the embossing step.

This device configuration does not require to make electrical contact with the depressed region of the conducting layer. It also results in very small overlap capacitance between the gate electrode and both the source and the drain electrode.

According to another aspect of the present invention a method is disclosed by which embossing is used to define a surface energy pattern for the high-resolution solution deposition of conducting electrodes on a substrate.

In UK 0009915.0 a general method is disclosed for the high-resolution patterning of liquid semiconducting or conducting materials by deposition from solution onto a substrate patterned into regions of high and low surface energy. The solution can be deposited by techniques such as dip-coating, blade-coating or inkjet printing, and is repelled from the regions of low surface/interface energy, and deposits selectively in the regions of high surface/interface energy on the substrate. The surface energy pattern is predefined by a broad range of experimental techniques, for example, by thermal transfer printing UK 0116174.4.

In the present invention we disclose a specific technique to define a surface energy pattern which is based on embossing a surface structure into a sacrificial polymer layer.

Figure 8:
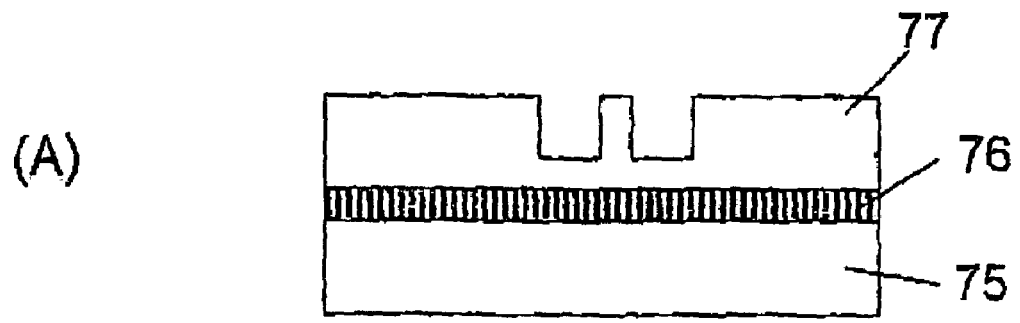
FIG. 8 shows a process for defining a surface energy pattern by embossing.
Figure 8:
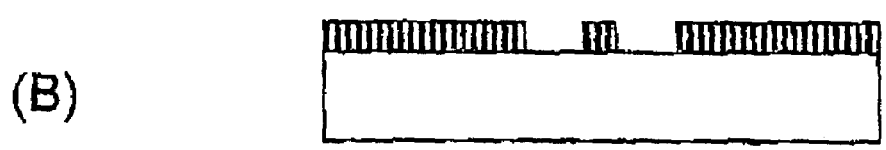
Figure 8:
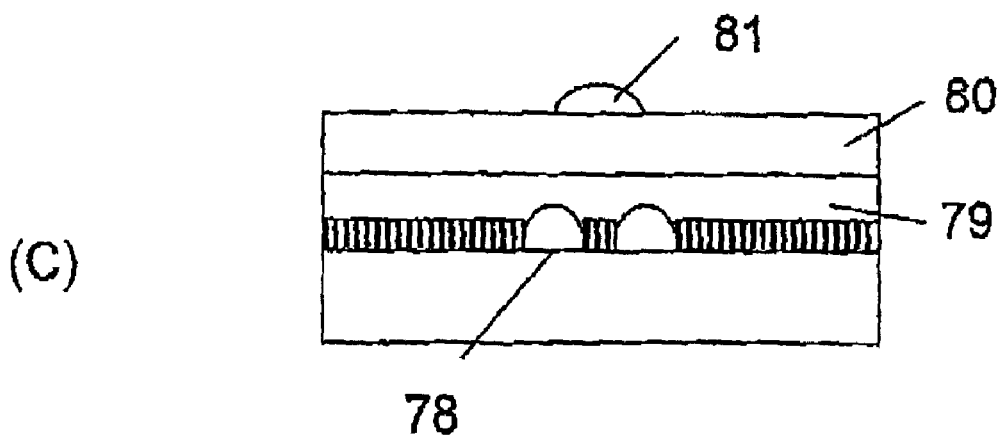

In one embodiment of this aspect of the invention a hydrophobic polymer layer 76 is deposited on top of a hydrophilic substrate (FIG. 8). An example of such a hydrophobic polymer might be a layer of polyimide with a thickness of 50 nm. The hydrophobic polymer might also have an aligned molecular structure, for example imposed by mechanical rubbing or by exposure to linearly polarized light, in order to act as an alignment layer for a subsequently deposited polymer layer. In a second step a sacrificial polymer layer 77 is deposited on top. Examples for sacrificial polymers are polyvinylphenol, novolak, or polymethylmethacrylate (PMMA) with a thickness of 500 nm. The sacrificial polymer layer is than embossed by pressing an embossing tool containing an array of protruding features into the substrate. In a subsequent step the embossed pattern is then transferred into the hydrophobic polymer layer by an etching step, such as an $O_2$ plasma etching step, and/or a more directional reactive ion etching step, exposing the surface of the hydrophilic substrate in the areas that are defined by the protruding features on the embossing tool. The etch process is stopped shortly after the surface of the substrate is exposed in the embossed regions. Due to the thickness difference between embossed and unembossed regions some sacrificial polymer remains in the unembossed regions protecting the surface of the hydrophobic polymer during the etching. After removal of the sacrificial polymer layer for example by washing of the substrate in a solvent in which the sacrificial polymer is soluble, the generated surface energy pattern can be used for the high resolution definition of source-drain electrodes, or gate electrode and interconnects with narrow line widths. For example, the process to fabricate transistor devices on top of such surface energy patterns can be as described in detail in UK 0009915.0.

In another embodiment, the hydrophobic polymer is embossed directly, without the sacrificial polymer 77 on top. Also in this case, etching, such as plasma etching is used to remove the residual material of hydrophobic polymer that remains in the embossed regions, and to expose the substrate surface. In this case the surface of the hydrophobic polymer is exposed to the etching medium, and care needs to be taken that the etching process preserves a large contact angle difference between the surface of the hydrophilic substrate and the surface of the exposed substrate.

In an alternative embodiment, the surface energy pattern might also be defined by a hydrophilic polymer, such as PVP or polyvinylalcohol onto a hydrophobic substrate such as PET. The hydrophilic polymer can be patterned in same way as described above.

Figure 9:
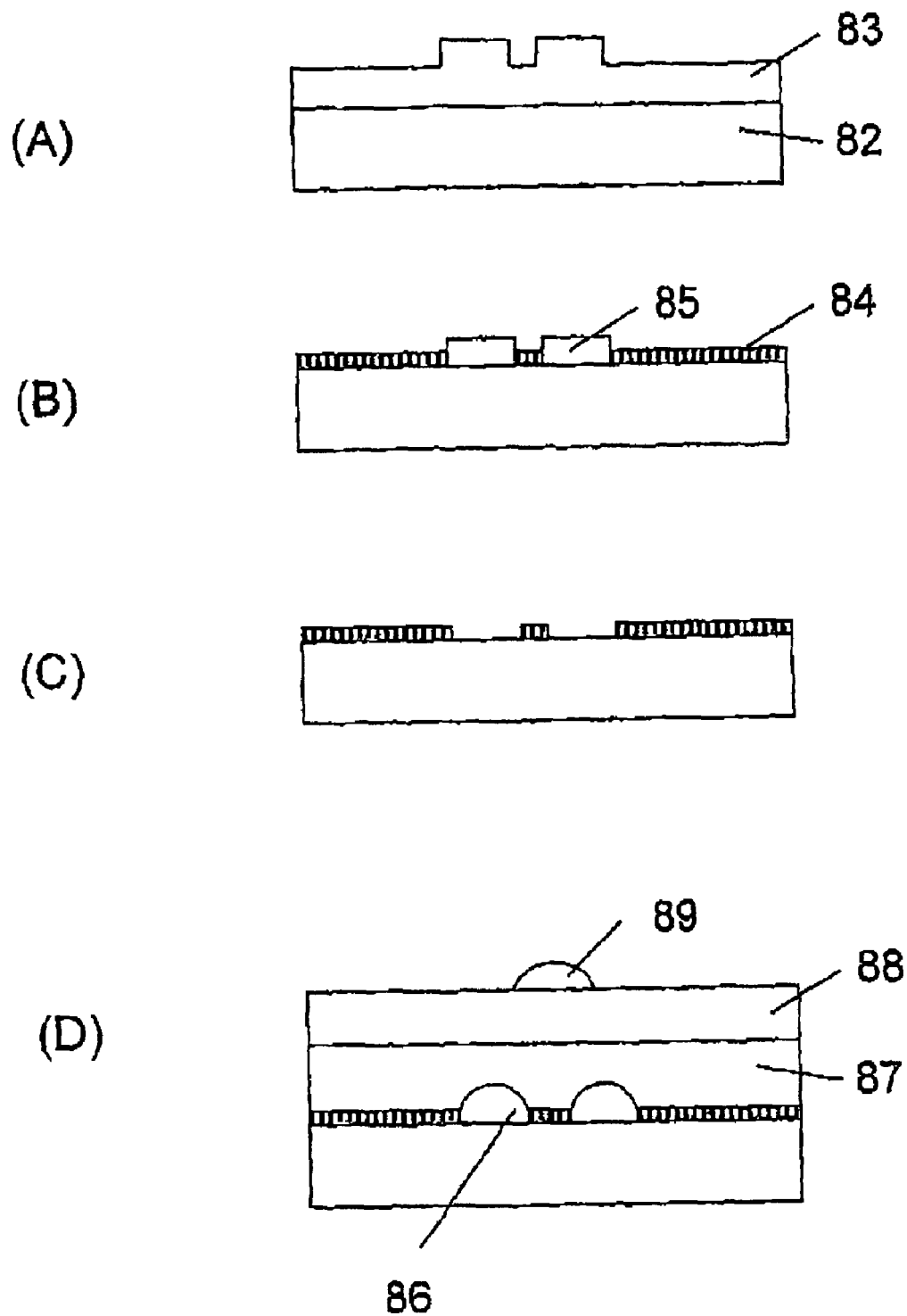
FIG. 9 shows another process for defining a surface energy pattern by embossing.

In another embodiment of the present invention (FIG. 9) a sacrificial polymer such as PVP, PMMA or novolak is first deposited onto the substrate 82, and then embossed in order to generate regions of different thickness. An etching step such as wet etching, or preferably a plasma etching step is then used to expose the substrate surface in the embossed regions. Then a self-assembled monolayer is deposited in the exposed suite regions by exposing the substrate to a vapour of a molecule containing a reactive group that is able to react with a functional group that is present on the substrate surface and form a self-assembled monolayer (SAM) on the surface. For example, in the case of a hydrophilic substrate such as glass alkylchlorosilanes, such as octyltrichlorosilane (OTS), alkylmethoxysilanes or fluoroalkylchlorosilanes bond to the hydroxyl groups on the surface and render the surface hydrophobic. Prior to exposure to the self-assembling molecule the substrate might also be treated in order to increase the number of functional groups on the surface. Such treatment may be in the form of a chemical treatment or a plasma treatment. If the etching of the sacrificial layer is performed by $O_2$ plasma etching, the exposed regions of the substrate are automatically left with a large number of hydroxyl groups.

After the substrate surface modification step the sacrificial polymer layer is removed by washing it in a good solvent. Care needs to be taken that the sacrificial polymer is removed completely from the substrates, and that no residues are left on the substrate, which might reduce the difference in surface energy between the SAM modified and the bare regions of the substrate. This is particularly important in the case of a high surface energy substrate that is prone to be coated with a thin layer of lower energy polymer. This can be achieved by suitable choice of the sacrificial polymer, for example in the case of a hydrophilic substrate such as glass, a polar polymer such as PVP is a suitable sacrificial polymer. Subsequently, devices are completed as described above.

This process to define surface energy patterns by embossing is not only applicable for patterning of source and drain electrodes on the substrate level. It can be applied to reduce linewidth of interconnect lines, or to patterning of a semiconducting layer in form of an active layer island. It can also be applied on upper levels of the device, for example in order to fabricate source-drain electrodes in bottom gate structures, or gate lines and interconnects with a narrow linewidth defined by a surface energy pattern. In this case care needs to be taken not to damage the underlying layer during the embossing step, and the etch time needs to be controlled carefully since the underlying polymer layers usually do not provide automatic etch stopping layers.

Figure 10:
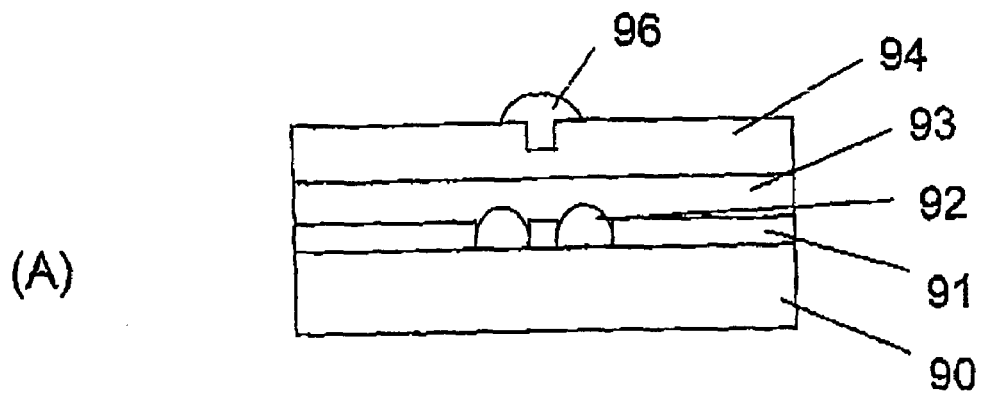
FIG. 10 shows various processes for locally increasing the capacitance of a dielectric layer.
Figure 10:
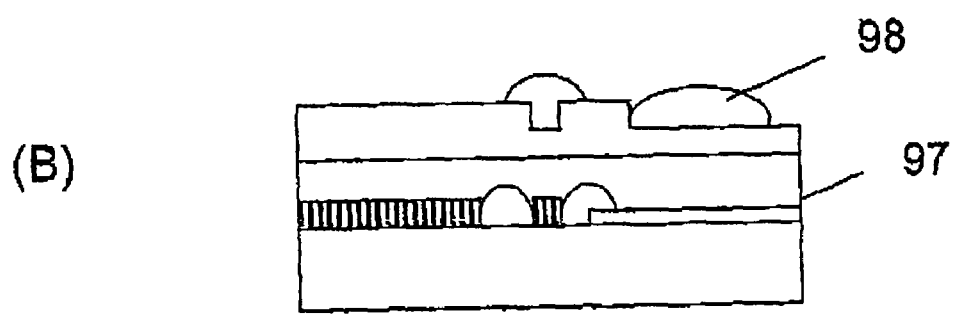
Figure 10:
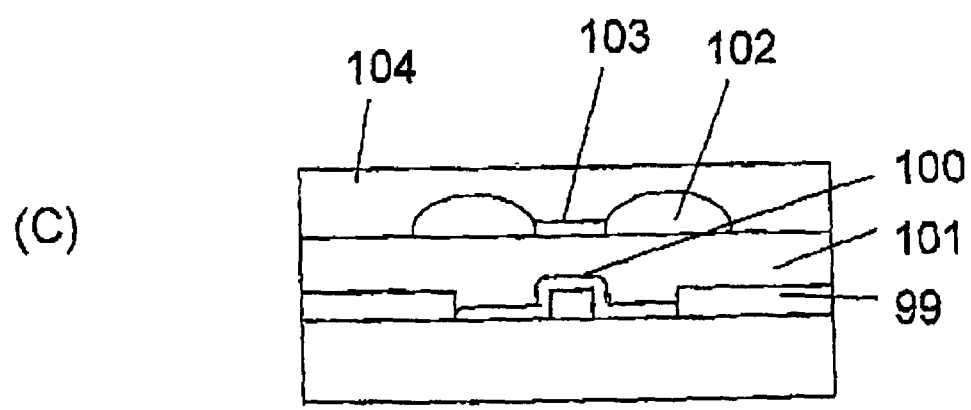

According to yet another aspect of the invention a method is disclosed by which a local change of the thickness of a dielectric layer can be used to locally increase the capacitance of the dielectric layer. This method is useful to locally enhance the capacitance of the gate dielectric in the active area of the transistor, or in the area of a discrete capacitor while in the remaining areas the capacitance of the dielectric layer remains at a low value. This minimizes any parasitic capacitance in regions where a high capacitance is not needed. In FIG. 10A a top-gate transistor is fabricated by depositing source-drain electrodes 92 on top of a substrate 90, that might also contain a surface energy pattern 91 to improve resolution. Layers of the semiconducting active material 93 and the gate dielectric 94 are then deposited. After deposition the thickness of the gate dielectric is essentially uniform at least in the area of the device. Then the gate dielectric 94 is embossed as to reduce its thickness in the region above the active channel of the transistor. In order to achieve optimally low parasitic source-drain-to-gate overlap capacitance the embossing tool needs to be aligned with respect to the source-drain electrode, and the width of the region in which the dielectric layer thickness is reduced should only be slightly larger, and generally be as close as possible to the length of the channel between the source and drain electrode. Subsequently, the conducting gate electrode 95 pattern is deposited. The difference to self-aligned schemes such as the one shown in FIG. 5B, that in the case of a local increase of gate dielectric capacitance the gate electrode does not need to be confined to the indented region of the gate dielectric 94. Even if the gate electrode deposition is unconfined, the overlap capacitance is low.

Similar methods can also be used to fabricate isolated discrete capacitors, for example for application in pixel capacitors in displays. In FIG. 10B, in addition to the capacitance in the active channel region, the capacitance is also enhanced in the region of a pixel electrode 97 connected to the drain electrode 92 of the TFT, and a ground bus 98 line. Such capacitors are useful in active matrix display applications to reduce kickback voltage effects.

A related scheme is shown for the bottom gate TFT in FIG. 10C. In this case a topographic profile 99 is first generated on the substrate. The topographic profile can be generated by a range of techniques such as, but not limited to, direct-write deposition, lithographic patterning or embossing. The topographic profile is such that in the active region of the transistor the topographic profile is protruding. Then a gate electrode pattern 100 is debated over the protruding region in the active channel region, and the adjacent indented regions. The device is then completed by deposition of gate dielectric 101, patterned source and drain electrode 102 (possibly aided with the help of a surface energy pattern 103) and semiconducting layer 104. The gate electrode needs to be deposited in such a way that the structure is effectively planarized. This is possible for example by adjusting the formulation of a spin-coated gate dielectric, or by using a blade coating technique, for the deposition of the gate dielectric that planarizes the surface of the gate dielectric layer.

The advantage of this structure is that the gate electrode does not need to be confined to the active channel region (i.e. the raised portion of the topographic profile), but still a small overlap capacitance can be achieved. This allows to use gate electrodes of large width, which is advantageous for applications in which a high conductivity of the gate electrode is required.

The device structures for the local increase of the capacitance of a dielectric layer are merely illustrative, and can be applied to range of different device structures including both bottom and top-gate architectures.

In all of the above techniques, the embossing step is performed preferrably at elevated temperature. The substrate that is embossed might either be in a solid phase or in a liquid phase. In a preferred embodiment of the invention the embossing step is performed in the solid state slightly below the glass transition temperature, $T_g$ of the substrate or the layer to be embossed. The letter temperatures generally are well known and can be found for instance in Polymer Handbook (Eds., J. Brandrup, H. Immergut, E. A. Grulke, John Wiley & Sons., New York, 1999), or can readily be determined according to standard thermal analysis methods. Preferably, the embossing process according to the present invention is carried out in a temperature range from about 50° C.

below to about 50° C. above $T_g$, and more preferably from about 40° C. below to about 40° C. above that transition. Most preferred is the temperature range from about 25° C. below to about 25° C. above $T_g$. For semi-crystalline polymers the microstructuring method according to the present invention is carried out in the temperature regime between about the glass transition temperature, $T_g$, and the melting temperature, $T_m$. The latter temperatures generally are also well known and can also be found for instance in Polymer Handbook or can readily be determined according to standard thermal analysis methods. Preferably, the microstructuring process is carried out in a temperature range from about 50° C. below $T_g$ to 1° C. below $T_m$, and more preferably from about 25° C. below $T_g$ to 2° C. below $T_m$. Most preferred is the temperature range from $T_g$ to about 5° C. below $T_m$. Other processing parameters, such as the load that is applied onto the master and time period during which it is applied, are less critical and are readily adjusted to ensure that the desired penetration of the master through one or more of the layers is effected.

Embossing is performed at a temperature of 150° C. (PVP), 100° C. (Polystyrene), 105° C. (PMMA) for up to 60 min with a load of about 1 kg/mm². Other processing conditions have also been shown to yield satisfactory results. Subsequently, the sample is cooled to room temperature before the pressure and the master are removed.

One of the other important features of the process is that the master or the substrate to be embossed can be in contact with a soft rubbery material through which the pressure during the embossing is transmitted in a homogeneous way, such that a homogeneous depth of microgrooves is obtained across the substrate.

The microcutting tool has microcutting protrusions on it. These suitably take the form of sharp protruding features, such as ridges, saw-tooth-type structures, spikes, and the like. The process of the manufacturing and the material of these microcutting tools are not critical to the microcutting process. However, the material of which the tool is made should be sufficiently hard, and the protrusions sufficiently sharp that the tool is capable of cutting through the layers. Where the tool is to cut through an upper layer of a multi-layer structure the height h of the features should exceed the thickness d of the layer or layers that are to be cut Characteristic dimensions of these features, such as the feature height h, preferably are in the range between 1 mm and 1 nm. More preferably these characteristic dimensions are between about 100 μm and 5 nm, and most preferably between 10 μm and about 10 nm. To provide suitable sharpness the radius of curvature of the protruding edges of these features should be preferably less than 500 nm, more preferably less than 100 nm, and most preferably less than 10 nm.

The sharp protruding features may be of simple geometries (e.g. line-shaped ridges) or more complex such as interdigitated features. Examples of suitable geometries include arrays of conical or pyramidal protrusions, and arrays of linear protrusion. One useful configuration is for the protrusions to be linear and parallel to each other.

The embossing tool suitably comprises at least one cutting edge, but preferably a multitude of edges. The latter allows for fabrication of a multitude of devices in one single embossing/microcutting step. The protruding edges may all be of the same geometry or may differ from each other. For instance, a microcutting tool according to the present invention may comprise arrays of line-shaped edges with which for example pre-structured electrical-conductive layers on top of a polymeric substrate can be cut in one step leading to an array of electrodes e.g. for use in electrical devices such as thin-film transistors.

In another example the embossing master could be either planar or cylinder-shaped or could have whatever geometry is best suited for the device and device configuration to be fabricated as well the fabrication process. Cylinder-shaped microcutting tools are particularly useful as they allow for embossing of a continuous flexible substrate in a reel-to-reel process. Reel-to-reel fabrication may offer higher throughput and lower cost capability than a standard batch process. In this context it is of particular significance that the embossing is performed preferably in the solid state, in which the embossed grooves retain their shape after the embossing tool is retracted. If the embossing were performed in the liquid phase. It would be necessary to reduce the substrate temperature before removing the microcutting tool, which would be difficult to achieve with a rolling cylindrical microcutting tool. The flexible tool could be constituted by a flexible plastics structure, or could be a flexible sheet of another material, for instance a thin (e.g. 20 micron thick) sheet of silicon.

Large area embossing tools according to one embodiment of the present invention can be fabricated for instance by combining a multitude of embossing tools comprising the same or different relief structures. Cylinder-shape embossing tools may be fabricated by first producing a planar tool which is subsequently rolled or bended.

Suitable masters an be made by a variety of methods known in the art, including, but not limited to anisotropic etching techniques, lithographic methods, electroplating, electroforming and the like.

Microcutting tools may be fabricated by first producing sharp feature in e.g. a silicon wafer by anisotropic etching techniques. That microshaped wafer may be used as the tool itself, or subsequently replicas of that wafer may be made for use as the tool. If the wafer is shaped as a negative of the desired tool then the tool may be moulded on the wafer. If the wafer is a positive version of the desired tool then a first replica of the wafer may be made, and then the tool may be formed as a replica of that first replica. The replicas are suitably made in materials such as thermoplastic and thermosetting polymers. This has the advantage that sharp grooves can be etched into the original master, e.g. a silicon wafer, which is often a more straight-forward process than etching sharp ridges. The polymeric replicas of such an original master should be sufficiently hard and capable of cutting through the layers to be structured. Accordingly, polymers used for replica production preferably have a glass transition temperature larger than 25° C., more preferably larger than 110° C. and most preferably lager than 150° C. The latter temperatures generally are well known and can be found for instance in Polymer Handbook (Eds., J. Brandrup, H. Immergut E. A. Grulke, John Wiley & Sons., New York, 1999). Preferably, high-glass transition, thermosetting resins are used for producing replicated microcutting tools, such as cyanate ester resins (e.g. 4,4'ethylidenediphenyl dicyanate and oligo(a-methylen-1,5-phenylencyanate) or epoxy resins such as tetrafunctional tetraglycidyl diaminodiphenymethane). The latter may be mixed before with an aromatic hardener such as 4,4'-diamino diphenyl sulfone, DDS. In order to fabricate replicas, a polymer melt, solution or pre-polymeric liquid as those listed above is cast, injection- or reaction moulded, and solidified in contact with the master structure by e.g. cooling, thermally or photochemically crosslinking. The original master surfaces may be rendered non-adhesive, e.g. by rendering it hydrophobic, using suitable surface treatments such as chemical modification with self-assembling monolayers (e.g. silylation from vapour phase using e.g. octadecyltrichlorosilane, perfluorodecyltricholorosilane and allyltrimethoxysilane). Alternatively, release coatings or agents such as silicon oil may be employed on the surface of the original master, it may also be useful to apply such coatings to the cutting surface of the tool.

As stated above, such polymeric replicas of the original master structure again can be used to produce $2^{nd}$, $3^{rd}$ or higher generation replicas ("sub-masters") which have either the same relief structure as the original master or a negative of it. Crucial is that the final microcutting tool comprises sharp protruding edges, such as sharp edges. In order to produce such "submasters" via e.g., embossing, injection- or reactive moulding, which subsequently can be used to replicate the final microcutting tool, preferably polymeric materials are employed that display good non-adhesive properties, such as perfluorinated polymers, polyolefins, polystyrene, or silicone rubbers (e.g. polydimethylsiloxane). Obviously, such sub-masters may be bended or rolled or shaped in whatever geometry is most desired depending on the device and device configuration to be fabricated in order to produce cylinder-shaped microcutting tools or microcutting tools of more complex geometries. For this purpose, it is useful to use flexible, polymeric materials, such as polydimethylsiloxane or polyolefins for submaster production.

Submasters according to one embodiment of the present invention were prepared by first producing a negative replica in polystyrene, PS (atactic polystyrene, $M_w \approx 105$ kg mol$^{-1}$, $T_g \approx 100°$ C.; Aldrich), For this purpose, PS granulates were embossed at 180° C. with a silicon master comprising sharp grooves (height h≈10 mm, periodicity Λ=500 mm, edge angle α=70°; MikroMasch, Narva mnt. 13,10151, Tallinn, Estonia), applying onto the latter a nominal pressure of 300 g mm$^{-2}$ for 5 min (cf. Stutzmann, N., Tervoort T. A., Bastiaansen, C. W. M. Feldman, K. & Smith, P. *Adv. Meter.* 12, 557 (2000)). Subsequently, $2^{nd}$ generation polydimethylsiloxane (Sylgard silicone elastomer 184; Dow Corning Corporation) replicas according to one embodiment of the present invention were fabricated by poring the pre-polymeric liquid onto these embossed PS films and curing it for 24 hours at room temperature in air atmosphere. The final microcutting tools were fabricated by producing a $3^{rd}$ generation thermoset replica by first melting the cyanate ester resin Primaset PT15 (Lonza) at 110° C. for 30 min, casting this melt onto the structured PDMS films, curing it for 4 hours at 170° C. and, subsequently for 24 hours at 200° C., and removing at the end the PDMS replicas from the cured, surface-structured thermoset.

In order to fabricate complex integrated circuits using microcutting the microcutting tool might be fabricated with an arbitrary pattern of wedges, that is able to define the critical device dimensions of an arbitrarily complex circuit. If such a complex master is defined by anisotropic etching of a crystalline wafer, sophisticated etching techniques such as corner compensation (cf. van Kampen, R. P. and Wolffenbuttel, R. F. *J. Micromech. Microeng.* 5, 91 (1995), Scheibe, C. and Obermeier, E. *J. Micromech. Microeng.* 5, 109 (1995), Enoksson, P. *J. Micromech. Microeng.* 7, 141 (1997)) need to be used in order to ensure that all protruding wedges of the tool that are supposed to cut a certain layer of the multilayer stack have the same height.

Alternatively, the microcutting tool may have a very simple wedge pattern, such as an array of parallel, linear wedges. In this case all critical device dimensions need to be layout on a regular grid. However, circuits of arbitrary complexity can still be defined by appropriately defining the coarse pattern of the layer to be cut, and by depositing appropriate interconnections between the regularly spaced devices. This process is particularly suited for a reel-to-reel process based on a combination of direct printing and microcutting. In a first step a regular array of source-drain electrodes with suitable interconnections are written by a technique such as inkjet printing. Then the channel gap between source-drain electrodes is defined by microcutting. An active matrix display is an example where such a regular array of TFTs is particularly useful.

It may be advantageous to hold the microcutting tool at the same temperature as the multilayer structure during the forcing step, e.g. within 5° C. Alternatively, they may be at different temperatures thus the temperature of the microcutting tool may be more than 5° C. different from the temperature of the multilayer structure during the forcing step.

In one embodiment of the invention the conducting material is a conducting polymer, such as PEDOT/PSS or polyaniline (PANI). However, the processes and devices described herein are not limited to devices fabricated with solution-processed polymers. Some of the conducting electrodes of the TFT and/or the interconnects in a circuit or display device (see below) may be formed from inorganic conductors, that can, for example, be deposited by printing of a colloidal suspension or by electroplating onto a pre-patterned substrate, in devices in which not all layers are to be deposited from solution one or more PEDOT/PSS portions of the device may be replaced with an insoluble conductive material such as a vacuum-deposited conductor.

For the semiconducting layer any solution processible conjugated polymeric or oligomeric material that exhibits adequate field-effect mobilities exceeding $10^{-3}$ cm$^2$/Vs, preferably exceeding $10^{-2}$ cm$^2$/Vs, may be used. Suitable materials are regioregular poly-3hexylthiophene (P3HT) or F8T2. For a review, see, for example H. E. Katz, J. Mater. Chem. 7, 369 (1997), or Z. Bao, Advanced Materials 12, 227 (2000). Other possibilities include small conjugated molecules with solubilising side chains (J. G. Laquindanum, at al., J. Am. Chem. Soc. 120, 664 (1998)), semiconducting organic-inorganic hybrid materials self-assembled from solution (C. R. Kagan, et al., Science 286, 846 (1999)), or solution-deposited inorganic semiconductors such as CdSe nanoparticles (B. A. Ridley, et al., Science 286, 748 (1999)). The semiconducting material might also be a vacuum deposited organic semiconductor such as pentacene. The thickness of the semiconducting materials is preferrably less than 200 nm, most preferrably less than 50 nm.

The semiconducting material can also be an inorganic semiconductor such as thin film silicon deposited by vacuum or plasma deposition techniques.

The gate dielectric is preferably a solution processed polymer layer, such as PVP, or PMMA. Alternatively, the gate dielectric might be a vapour deposited inorganic dielectric, such as $SiO_2$ or $Si_3N_4$, or $BaTiO_3$. The thickness of the gate dielectric is preferably less than 2 µm, most preferably less than 500 nm.

Preferably, all materials are deposited by direct printing and solution processing techniques, such as inkjet printing, soft lithographic printing (J. A. Rogers et al., Appl. Phys. Lett. 75, 1010 (1999); S. Britain et al., Physics World May 1998, p. 31), screen printing (Z. Bao, et al., Chem. Mat. 9. 12999 (1997)), and photolithographic patterning (see WO 99/10939), offset printing, spin-coating, blade coating or dip coating, curtain coating, meniscus coating, spray coating, extrusion or plating. Ink-jet printing is considered to be particularly suitable for large area patterning with good registration, in particular for flexible plastic substrates.

However, some of the materials might also be deposited from the vapour phase, or in another suitable way.

The device(s) can be fabricated on any substrate material, such as glass, or Perepex or a flexible, plastic substrate such as polyethersulphone. Such a material is preferably in the form of a sheet, is preferably of a polymer material, and may be transparent and/or flexible. In the case of rigid substrate, such as glass, the substrate is preferably coated with a layer of polymer with a thickness of typically 500 nm to 1 µm, in order to prevent damage to the embossing tool that might arise if it was pressed onto the surface of a rigid substrate.

Although preferably all layers and components of the device and circuit are deposited and patterned by solution processing and printing techniques, one or more components such as a semiconducting layer may also be deposited by vacuum deposition techniques and/or patterned by a photolithographic process.

When depositing polymer multilayer structures by successive solution deposition and printing steps, the integrity of the layer sequence relies on the alternating deposition of polymer materials from orthogonal solvents, in order to form well controlled interfaces. In particular, it is important that the active interface between the semiconducting and gate dielectric polymer is abrupt and that in any case the solvent sequence for the deposition of the multilayer structure is chosen such that the solubility of the previous layer in the solvent used for the deposition of the next layer is sufficiently small. Techniques for building up multilayer structures from solution are disclosed in PCT/GB00/04934.

Devices such as TFTs fabricated as described above may be part of a more complex circuit or device in which one or more such devices can be integrated with each other and or with other devices. Examples of applications include logic circuits and active matrix circuitry for a display or a memory device, or a user-defined gate array circuit.

Any of the semiconducting or dielectric layers of the device may also be patterned, for example by direct inkjet printing. In particular, the semiconducting layer may be patterned into an active layer island in order to reduce the crosstalk and leakage currents between neighbouring transistors in a logic circuit or active matrix display.

The present invention is not limited to the foregoing examples. Aspects of the present invention include all novel and/or inventive aspect of the concepts described herein and all novel and/or inventive combinations of the features described herein.

The applicant draws attention to the fact that the present inventions may include any feature or combination of features disclosed herein either implicitly or explicitly or any generalisation thereof, without limitation to the scope of any definitions set out above. In view of the foregoing description it will be evident to a person skilled in the art that various modifications may be made within the scope of the inventions.

The invention claimed is:

1. A method for forming an electronic device in a multilayer structure comprising the steps of:
    depositing a first layer in such a way as to define one or more electrodes of the device and a topographic profile;
    depositing at least one non-planarizing layer on top of the first layer such that the topographic profile of the surface of the at least one non-planarizing layer conforms to that of the laterally extending first layer; and
    depositing a pattern of at least one additional layer onto the top-most non-planarizing layer to define one or more elements of the device, such that the lateral location of the additional layer is defined by the shape of the topographic profile of the non-planarizing layer, and whereby the additional layer is laterally aligned with the topographic profile in the first layer.

2. A method as claimed in claim 1, wherein the additional layer is deposited from solution.

3. A method as claimed in claim 1, wherein prior to the step of depositing the additional layer, the method further comprises the step of performing a surface modification process that has a different effect on relatively raised regions of the non-planarizing layer in comparison to relatively depressed regions of the non-planarizing layer, so as to generate a surface energy contrast between the relatively raised and relatively depressed regions of the non-planarizing layer.

4. A method as claimed in claim 3, wherein the surface modification process comprises selectively depositing a surface modification material which modifies the surface energy of the substrate.

5. A method as claimed in claim 1, wherein the substrate comprises a flexible plastic substrate such as poly(ethleneterephtalate) (PET), polyethersulphone (PES) or polyethernaphtalene (PEN).

6. A method as claimed in claim 3, wherein the step of performing a surface modification process comprises laminating the surface of the substrate by bringing the surface into contact with a flat stamp bearing a surface modification material.

7. A method as claimed in claim 6, wherein the surface modification material is a self assembled monolayer (SAM).

8. A method as claimed in claim 6, wherein the SAM is able to bond to a functional group on the surface, and has a tail containing a polar group.

9. A method as claimed in claim 1, wherein the non-planarizing layers are deposited by vacuum deposition techniques.

10. A method as claimed in claim 1, wherein the non-planarizing layers are deposited from solution.

11. A method as claimed in claim 6, further comprising the step of applying a mechanical support layer to the surface of the non-planarizing layer in order to maintain separation of the flat stamp and relatively depressed regions of the non-planarizing layer during the step of performing a surface modification process.

12. A method as claimed in claim 1, wherein prior to the step of depositing at least one additional layer, the method further comprises the step of applying a surface modification layer on one of the relatively raised or relatively lowered regions of the top-most non-planarizing layer such that the additional layer is confined to the other of the relatively raised or relatively lowered regions of the top-most non-planarizing layer.

13. A method as claimed in claim 12, wherein prior to the step of applying a surface modification layer, a surface treatment step is applied selectively to one of the relatively raised or relatively lowered regions of the non-planarizing layer.

14. A method as claimed in claim 12, wherein the surface treatment step comprises a step in which the additional non-planarizing layer is made wetting for the deposition of the additional layer.

15. A method as claimed in claim 12, wherein the surface modification layer is a low surface energy polymer.

16. A method as claimed in claim 3, wherein the step of performing a surface modification process comprises depositing a surface modification material onto the substrate at an oblique angle such that the surface modifying material is deposited onto the raised portions of the substrate, and the depressed portions are shadowed by the raised portions during the deposition of the surface modification material.

17. A method as claimed in claim 16, wherein the low surface energy polymer is a fluoropolymer.

18. A method as claimed in claim 1, wherein the additional layer forms an electrically functional element of the electronic device.

19. A method as claimed in claim 12, wherein the surface energy of surface modification layer is modified according to a topographic profile of the surface modification layer.

20. A method as claimed in claim 1, wherein the first layer defines a gate electrode of the electronic device.

21. A method as claimed in claim 1, wherein the pattern of the at least one additional layer deposited onto the non-planarizing layer comprises source and drain electrodes of the electronic device.

22. A method as claimed in claim 1, wherein the first layer defines a source and a drain electrode of the electronic device.

23. A method as claimed in claim 1, wherein the pattern of the at least one additional layer deposited onto the non-planarizing layer comprises a gate electrode of the electronic device.

24. A method as claimed in claim 1, wherein the electronic device is a transistor.

25. A method as claimed in claim 1, wherein the step of depositing at least one non-planarizing layer comprises depositing a first non-planarizing layer and a second non-planarizing layer.

26. A method as claimed in claim 25, wherein the first non-planarizing layer is a semiconductor layer.

27. A method as claimed in claim 26, wherein the second non-planarizing layer is a dielectric layer.

28. A method as claimed in claim 27, wherein the dielectric layer is a gate dielectric layer.

29. A method as claimed in claim 1, wherein the additional layer is laterally aligned with the topographic profile in the first layer such that a lateral overlap between edges of the additional layer and boundaries of the topographic profile in the first layer to which the additional layer is confined is less than 10 µm.

30. A method as claimed in claim 1, wherein the additional layer is laterally aligned with the topographic profile in the first layer such that a lateral overlap between edges of the additional layer and boundaries of the topographic profile in the first layer to which the additional layer is confined is less than 5 µm.

31. A method as claimed in claim 1, wherein the additional layer is laterally aligned with the topographic profile in the first layer such that a lateral overlap between edges of the additional layer and boundaries of the topographic profile in the first layer to which the additional layer is confined is less than 1 µm.

32. A method as claimed in claim 3, wherein the step of performing a surface modification process on a surface having a topographic profile comprising at least one relatively raised region and at least one relatively depressed region, comprises:
    depositing a planarizing sacrificial layer over the topographic profile;
    etching the surface of the sacrificial layer to reveal the relatively raised regions of the surface, but leaving the relatively depressed regions covered by the sacrificial layer, so as to define a layer having a substantially planar upper surface;
    performing a surface energy modification process on the surface layer; and
    removing the remaining areas of the sacrificial layer to reveal the depressed regions.

33. A method as claimed in claim 32, wherein the planarizing sacrificial layer is deposited by spin coating.

34. A method as claimed in claim 32, wherein the planarizing sacrificial layer is deposited by a polymer solution.

35. A method as claimed in claim 34, wherein the polymer solution is an organic based polymer solution containing siloxane.

36. A method as claimed in claim 32, wherein the etching step comprises an oxygen plasma etching step.

37. A method as claimed in claim 32, wherein the step of performing a surface energy modification process on the surface layer, comprises exposing the surface layer to a vapor of a self-assembling molecule.

38. A method as claimed in claim 32, wherein the step of removing the remaining areas of the sacrificial layer comprises washing the substrate in a solvent in which the sacrificial layer is soluble, but in which the surface layer is insoluble.

* * * * *